LOW NOISE REACTANCE AMPLIFIER
Filed Aug. 9, 1967
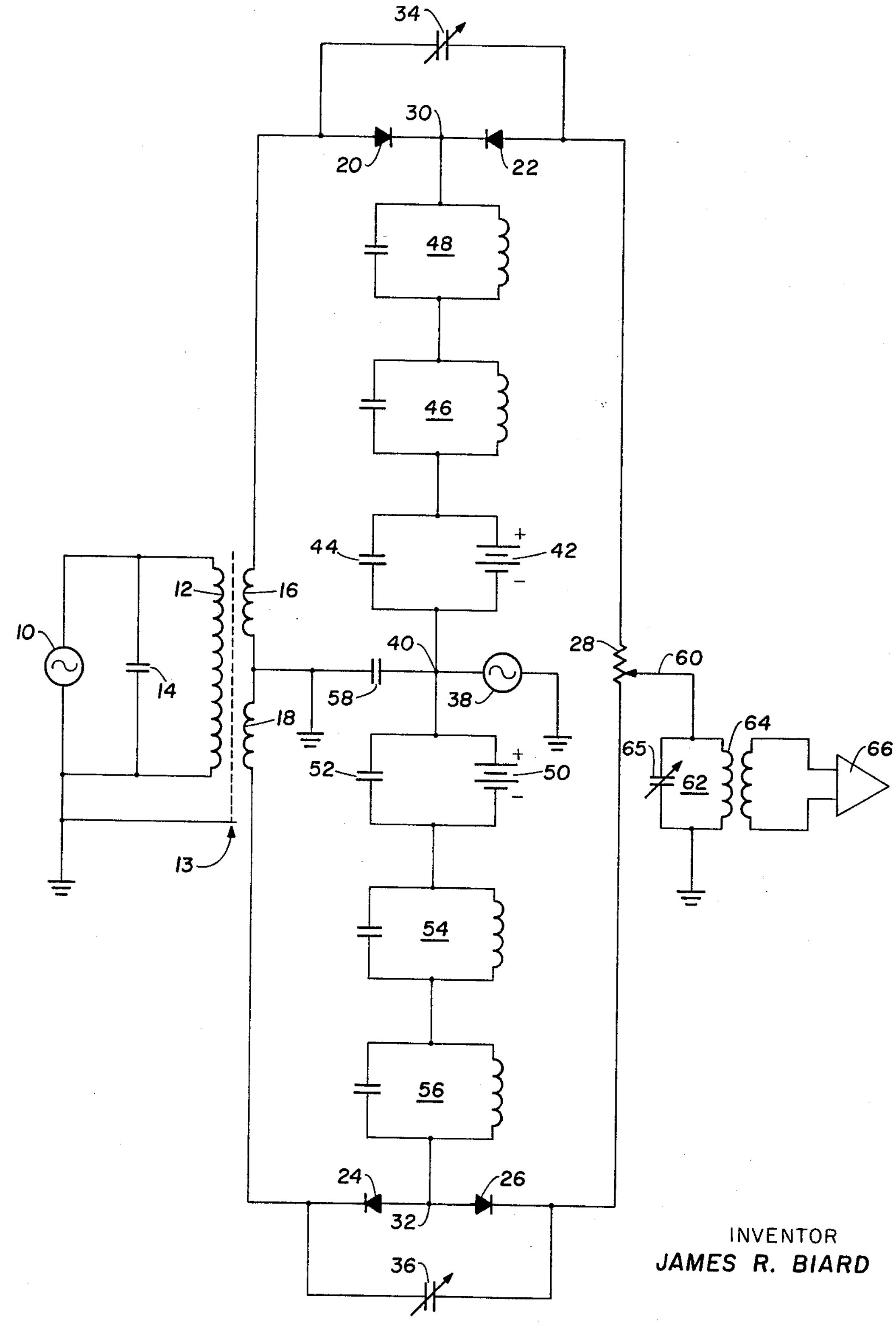
INVENTOR
JAMES R. BIARD
E. Mickey Hubbard
ATTORNEY United States Patent Office 3,510,674

Patented May 5, 1970

3,510,674
LOW NOISE REACTANCE AMPLIFIER

James Robert Biard, Richardson, Tex., assignor to Texas Instruments Incorporated, Dallas, Tex., a corporation of Delaware Filed Aug. 9, 1967, Ser. No. 659,456
Int. Cl. H03f 7/04, 11/00
U.S. Cl. 307—88.3 8 Claims

ABSTRACT OF THE DISCLOSURE

A low noise reactance amplifier having four semiconductor diodes connected in a bridge configuration. A high frequency pump source drives each of the diodes through regions of capacitance nonlinearity while the overall capacitance of selected pairs of the diodes is maintained constant. Tuned circuits are coupled to the diode bridge configuration to substantially eliminate charge transfer from the diodes at the frequency of the pump source. Input signals having frequencies substantially lower than the frequency of the pump source are introduced into the diode bridge configuration for interaction with the capacitance nonlinearities. A resonant circuit output coupled to the diode bridge configuration provides an amplified replica of the input signal.

This invention relates to amplifiers, and more particularly to amplifiers utilizing the nonlinear capacitance variation of reactance elements for amplification of input signals.

Reactance amplifiers have heretofore been developed wherein a constant frequency pump signal and a relatively low-frequency input signal to be amplified are concurrently applied to a nonlinear reactance. A series of frequencies, including the sums and differences of the pump and input signals, then appear at the terminals of the nonlinear reactance as an output signal. The output signal may be utilized to provide an amplified replica of the input signal due to the principle that when an alternating signal is fed into or taken from a nonlinear reactance element, the magnitude of the resulting power is directly or inversely proportional to the frequency or functions of the frequency of the applied signal. By the application of a pump signal having a frequency substantially higher than the frequency of the input signal to be amplified, a given amount of input signal power will result in a greater magnitude of power to be taken from the pump source and converted into power at sideband frequencies. By effectively attenuating the pump frequency component of the output signal, relatively low-frequency input signals may be substantially amplified. A detailed description and disclosure of a low-frequency reactance amplifier of this type is found in applicant's U.S. Pat. No. 3,316,421, issued Apr. 25, 1967.

In addition to gain resulting from the production of sum and difference sidebands from the pump and input signals, additional gain in previously developed reactance amplifiers is provided due to a negative-resistance effect at the amplifier output terminals produced by the interaction of sum and difference frequency signals with the component of time-varying capacitance at the second harmonic of pump frequency. This negative-resistance effect is disclosed in detail in applicant's U.S. Pat. No. 3,316,421, issued Apr. 25, 1967; and in applicant's article entitled Low-Frequency Reactance Amplifier, Proceedings of the IEEE, vol. 51, No. 2, pp. 298–303, February 1963. While such a negative-resistance effect in a reactance amplifier has been found to be beneficial in several aspects, the dependence on the component of the time-varying capacitance at the second harmonic of the pump frequency has tended to limit the noise and gain performance of previous reactance amplifiers. For instance, if the pump voltage of a reactance amplifier utilizing such a negative-resistance effect is increased above a certain threshold, the amplifier will become unstable due to the dependence upon the second harmonic components. This gain instability due to the second harmonic component of the time-varying capacitance precludes the use of large pump voltage which would be required to minimize the input noise resistance and thereby substantially limits the noise performance of the amplifiers.

It is therefore an object of this invention to improve reactance amplifiers embodying linear reactance elements.

It is a more specific object of this invention to provide a reactance amplifier which is not limited in performance by second harmonic components of time-varying nonlinear capacitance.

It is yet another object of this invention to improve the noise figure and to substantially reduce the equivalent input noise resistance of reactance amplifiers utilizing nonlinear reactance elements.

In accordance with the present invention, nonlinear reactance elements are connected in a bridge configuration. The reactance elements each have barrier capacitance layers connected in series by a junction and driven through regions of capcitance nonlinearity at a constant angular frequency. The junctions of the capacitance layers are substantially isolated from charge transfer at the constant angular frequency so that the overall capacitance of the reactance elements remains generally constant. Input signals are introduced to the junctions of the capacitance layers and an output is coupled to the bridge.

For a more complete understanding of the present invention and for further objects and advantages thereof, reference may now be had to the following description taken in conjunction with the accompanying drawing which illustrates in schematic detail an embodiment of the present invention.

Referring now to the schematic embodiment shown in the drawing, a source of pump signal 10 is connected across the primary winding 12 of the electrostatically shielded transformer 13. A capacitor 14 is connected across the pump signal source 10 in order to sharply tune the pump signals to a desired frequency. In general operation, the frequency of the pump source 10 will be constant and of a relatively high magnitude, as for instance in the range of several hundred kilocycles per second.

The secondary of the transformer 13 is center-tapped to ground to form generally identical tightly coupled windings 16 and 18. A pair of diodes 20 and 22 are serially connected with winding 16 and a second pair of diodes 24 and 26 are serially connected with winding 18. A relatively low resistance 28 is connected across diodes 22 and 26 to connect the diode pairs in a bridge configuration. Each pair of the diodes is connected in a back-to-back configuration, with the cathodes of diodes 20 and 22 being connected at a junction 30 and the anodes of diodes 24 and 26 being connected together at a junction 32.

A trimmer capacitor 34 is connected across the first pair of diodes 20 and 22, and a trimmer capacitor 36 is connected across the second pair of diodes 24 and 26. Trimmer capacitors 34 and 36 allow compensation to be made for residual differences in diode characteristics of the diode pairs, and also to compensate for any undesired imbalance in input voltages from windings 16 and 18. In the practice of the invention, the total capacitance presented by the first pair of diodes should be generally equal to the overall capacitance provided by the second pair of diodes.

A source of low-frequency input signals 38 is connected to an input terminal 40. A bias battery 42, which may comprise a small mercury cell, is connected at its negative terminal to the input terminal 40. A bypass capacitor 44 is connected in parallel with the battery 42 to bypass the battery 42 at pump frequency. A pair of L–C tank circuits 46 and 48 are connected in series between the positive terminal of the battery 42 and the junction 30 between diodes 20 and 22. Tuned circuit 46 is resonant at pump frequency, while tuned circuit 48 is resonant at the second harmonic component of the pump frequency.

Similarly, a bias battery 50 is connected at its positive terminal to the input terminal 40 and is bypassed at pump frequency by a parallel connected capacitor 52. A pair of L–C tuned circuits 54 and 56 are connected in series between the negative terminal of the battery 50 and the junction point 32 between the diodes 24 and 26. A capacitor 58 is connected between the input terminal 40 and ground in order to bypass the input signal source 38 at pump frequency to minimize the coupling of pump signal into the input signal source 38.

Resistor 28 comprises a relatively low resistance potentiometer having a movable arm 60 which may be adjusted to properly balance the bridge formed by the two pair of diodes, the windings 16 and 18, and the resistance 28. The output signal received by the movable arm 60 is fed into a grounded tuned circuit 62 comprising the inductance 64, the capacitance of the diode bridge and the trimmer capacitor 65. The inductance 64 of the resonant tank 62 is represented by a coupling transformer which is also connected to an amplifier 66 to provide an amplified output.

It will be understood that the present reactance amplifier may be utilized with any of the modifications for gain stabilization or automatic volume control disclosed in applicant's U.S. Pat. No. 3,316,421, if desired.

In operation, the pump source 10 will swing the individual diodes through repetitive cycles of nonlinear capacitance change. The battery 42 is of a magnitude to reversely bias the back-to-back connected diodes 20 and 22 to a selected region of nonlinear capacitance, while the battery 50 will reversely bias the oppositely connected back-to-bask diode pair 24 and 26 to their similar region of capacitance nonlinearity. The capacitors 35 and 36 will be adjusted so that the overall capacitance at pump frequency of the pair of diodes 20 and 22 with capacitor 34 is equal to the capacitance at pump frequency of the pair of diodes 24 and 26 with capacitor 36. Although the individual diodes are varied in capacitance at pump frequency, the overall capacitance of the diode pairs will not vary at the pump frequency, as will be later explained.

Low-frequency input signals are provided from the source 38 to the input terminal 40 and are fed both to junction 30 and junction 32 for interaction with the varying nonlinear capacitances of the individual diodes. The connection of diodes 20 and 22 cathode-to-cathode and diodes 24 and 26 anode-to-anode provides a differential bridge action when single ended input signals are fed into the input terminal 40. The input signal is superimposed on the bias voltages supplied by the oppositely poled batteries 42 and 50 in order to differentially vary the overall capacitances of the diode pairs at the input signal frequencies. As is well known in the art, whenever two signals of different frequencies are concurrently impressed upon elements having nonlinear capacitance, a series of frequencies including the sums and differences of the two applied signal frequencies appear on the terminal of the nonlinear elements. Voltages thus appear at the resistor 28 in the form of sum and difference sidebands, the voltages then being applied to the tuned circuit 62.

The current produced by the interaction of the pump voltage and the signal frequency component of the time-varying capacitance of the diodes is generally equal to the product of the input signal voltage, and the conversion susceptance of the diode pairs. The voltage developed across the inductance 64 of the tuned circuit 62 will then be directly proportional to the admittance of the tank. This admittance is made substantially less than the conversion susceptance of the diode-pair, and when the optimum pump voltage is used, the input voltage is in effect multiplied by the ratio of the pump-frequency susceptance of the diode-pair and the admittance of the tank, thereby producing voltage amplification. This amplified replica of the input voltage is fed into the amplifier 66 to provide an amplified signal useful in many applications.

The use of the tuned circuits 46 and 48, 54 and 56 in the circuit is for the purpose of substantially isolating the center junctions of the back-to-back diodes from charge transfer at the pump frequency and significant harmonics. Tuned circuits 46 and 54 in the present embodiment are tuned for resonance at the pump frequency, while the tuned circuits 48 and 56 are tuned to resonance at the second harmonic of the pump frequency. It will be apparent that other circuits are available for isolation of the junction of the diodes, as, for instance, high impedance resistances, broadband tuned inductances or the like.

Although the present embodiment of the invention has been described with respect to a pair of back-to-back diodes connected in a bridge configuration, similar results may be provided by different types of nonlinear capacitance devices having series connected barrier capacitance layers. For instance, p–n–p and n–p–n variable capacitance diode elements, wherein the center n or p region is effectively isolated from charge transfer and is utilized for a signal input, may be effectively utilized in place of the illustrated back-to-back diodes. Other devices having suitable variable capacitance layers may include, among others, Schottky diodes, p–n junctions, m–o–s devices and suitable magnetostrictive and piezoelectric variable capacitance devices.

As previously disclosed, although the individual diodes are repetitively nonlinearly varied in capacitance, the overall capacitance at pump frequency of the pair of diodes 20 and 22 remains equal to the overall capacitance at pump frequency of the diode pair 24 and 26. This constant capacitance substantially eliminates the prouction of second harmonic components of the time-varying capacitance. The phenomena of constant capacitance during an RF cycle for isolated variable capacitance diodes has been disclosed in detail in an article by J. M. Early in the Proceeding of the IRE, pages 1905–1906, November 1960. As disclosed in this article, only nonlinear elements which vary in capacitance according to the one-half power law are exactly constant during an RF cycle. Thus, such nonlinear elements are preferred in the practice of the present invention, although nonlinear elements which vary according to other power laws may be utilized with some loss in performance.

Briefly, the relative charges of the diodes may be represented as follows:

$$Q_1 = qN_D X_1 \quad (1)$$

and $$Q_2 = qN_D X_2$$

in which $q$ is the electronic charge and $N_D$ the donor concentration of the back-to-back connected diodes. If the junction between two back-to-back diodes is effectively isolated from charge transfer to ground at the pump frequency and significant harmonics, then the charge of the junction between the diodes is equal to the sum of $Q_1$ and $Q_2$, and is thus proportional to the sum $X_1+X_2$. As the practice of the present invention provides that the center-junction between the two back-to-back diodes in a diode pair is substantially isolated from charge transfer at the pump frequency and second harmonic, the junction charge remains essentially constant during each cycle of the RF pumping signal, and therefore $X_1+X_2$ is also essentially constant. The overall capacitance of the two diodes in series is therefore essentially constant during an RF cycle. Due to this constant capacitance, the back-to-back diode configuration utilized in the present invention is a very poor harmonic generator at its external terminals at the RF pump frequency.

For a further explanation of the performance of the present circuit, the voltages impressed on windings 16 and 18 may be assumed to equal as follows:

$$v_{16}=-v_{18}=-V_p \cos pt \qquad (2)$$

The current flowing to the output circuit through diodes 20 and 22 may then be represented by:

$$i_{16}=pC_aV_p \sin pt \qquad (3)$$

and the current flowing through diodes 24 and 26 by:

$$i_{18}=pC_bV_p \sin pt \qquad (4)$$

in which $C_a$ is the overall capacitance of diodes 20 and 22 and $C_b$ is the overall capacitance of 24 and 26.

The total output current of the circuit may then be represented as follows:

$$i_o=i_{16}-i_{13}=p(C_a-C_b)V_p \sin pt \qquad (5)$$

in which the time-varying capacitance for an input signal of $$e_a=E_a \cos at \qquad (6)$$

due to the opposite poling of the diodes, is equal to:

$$C_a=C_o+\frac{dC}{dV_b}E_a \cos at \qquad (7)$$

and $$C_b=C_o-\frac{dC}{dV_b}E_a \cos at \qquad (8)$$

where $V_b$ is the battery bias voltage.

Solving Equations 4, 6 and 7 results as follows:

$$i_o=2p\frac{dC}{dV_b}V_pE_a(\cos at)(\sin pt) \qquad (9)$$

and therefore the output voltage is:

$$V_o=\frac{2p\frac{dC}{dV_b}V_p}{g_T}E_a(\cos at)(\sin pt) \qquad (10)$$

where $g_T$ is the conductance of the tuned output circuit.

For one-half power law diodes it can be shown that a range of optimum combinations of pump voltage and bias voltage exists which will maximize the conversion susceptance, $$pVp\frac{dC}{dV_b} \qquad (11)$$

while at the same time minimizing forward bias currents in the individual diodes. A specific example of a possible circuit would provide the following optimum values of $Vp$ and $V_b$ if the individual diodes are instantaneously biased up to zero volts:

$$Vp|_{opt}=8d, V_b|_{opt}=3d$$

where $d$ is the contact potential of the junction barrier. When an optimum combination of pump and bias voltage are employed, $$pVp\frac{dC}{dV_b}\bigg|_{max}=pC_o\bigg|V_b \qquad (12)$$

i.e., the conversion susceptance of the diode pair is equal to the overall susceptance of the diode pair at pump frequency.

Solving Equations 10 and 12, $$v_o=\frac{2pC_o}{g_T}E_a(\cos at)(\sin pt) \qquad (13)$$

Considering the voltage gain as the ratio of the peak of the output signal envelope to the peak of the input signal, the voltage gain may be represented as follows:

$$\frac{V_o}{E_a}=\frac{2pC_o}{g_T} \qquad (14)$$

When the three trimmer capacitances 34, 36 and 65 are negligible compared to $2C_o$, i.e., when inductance 64 is tuned only by $2C_o$, the Q of the tuned output circuit may be represented by:

$$Q=2pC_o/g_T \qquad (15)$$

then $$V_o/E_a=Q \qquad (16)$$

From an inspection of Equation 14, it will be seen that the gain of the present circuit is not dependent upon the second harmonic component of the time-varying capacitance, and thus the pump voltage may be increased to its optimum value without attendant circuit instability. Further, due to the fact that in the present circuit there is no substantial harmonic of time-varying capacitance to alter the impedance of the output tuned circuit or to couple the output sidebands together, the output thermal noise in the present circuit is merely the sum of the upper and lower sideband noise powers. It may thus be shown that:

$$R_n=2X_c/Q \qquad (17)$$

wherein $R_n$ is the equivalent input noise resistance of the present circuit, $X_c$ is the total reactance of the diode bridge, and Q is the ratio of the inductive reactance at resonance to the resistance of the output tuned circuit. This value compares favorably with the equivalent noise resistance of the circuit of reactance amplifiers previously developed wherein $R_n$ is approximately equal to $X_c$.

In practice, in a circuit constructed in accordance with the invention including four semiconductor diodes reversely biased at 1.35 volts and having individual capacitances of that bias voltage of approximately 145 picofarads, with a peak pump voltage of 4.5 volts, and with a loaded Q of the output tuned circuit of approximately 50, equivalent input noise resistances of between 50 and 100 ohms have been measured. The above listed bias conditions result in an instantaneous forward bias on each diode of .337 volts, which for silicon diodes is adequate to prevent undesirable forward current flow. Such equivalent input noise resistances may be compared with input noise resistances of several thousand ohms determined from reactance amplifiers heretofore developed which are dependent upon second harmonics of the time-varying capacitance.

The back-to-back diode bridge configuration of the invention results in improved temperature stability, as the changes in contact potential of the circuit with temperature will tend to cancel between the diode pairs if the diode pairs are maintained at the same temperature. Because of the elimination of the second harmonic components in the present circuit, the gain of the circuit is directly proportional to the peak pump voltage, making the present circuit an ideal two-quadrant multiplier with little distortion with respect to the pump input. Because of the balance of the bridge configuration with respect to the input signals, even order nonlinearities of the input signal will be cancelled and only odd numbered nonlinearities with respect to the input signal will exist in the output circuit. By proper reverse bias of the diode pairs, very linear outputs for relatively low amplitude input signals may be obtained.

It will be apparent that the present invention eliminates and minimizes many disadvantages apparent in reactance amplifiers heretofore developed. The present amplifier supplies a substantially lower equivalent input noise resistance, thereby providing an improved noise figure enabling the amplification of extremely small input signals, making the amplifiers useable for many applications not heretofore possible. By eliminating the dependence of the reactance amplifier on the second harmonics of the time-varying capacitance in the circuit, the amplitude of the pump frequency source may be increased to provide increased gain without driving the circuit into instability.

Having described the invention in connection with a certain specific embodiment thereof, it is to be understood that further modificaitons would be suggested to those skilled in the art and it is intended to cover such modifications as fall within the scope of the appended claims.

What is claimed is:

1. A low noise reactance amplifier comprising:
(a) a first pair of reactance elements connected at a first junction, each of said first pair of reactance elements exhibiting individually a non-linear capacitance as a function of voltage,
(b) a second pair of reactance elements connected at a second junction, each of said second pair of reactance elements exhibiting a non-linear capacitance as a function of voltage,
(c) means for connecting said first and second pairs of reactance elements in a bridge configuration,
(d) a pump source connected to said bridge configuration for driving at a constant angular frequency each of said reactance elements through regions of capacitance non-linearity while the overall capacitance of each said pair of reactance elements is a generally stable conversion capacitance,
(e) input means connected to each of said first and second junctions for coupling input signals to said first and second pair of reactance elements so as to differentially unbalance said bridge configuration, the frequency of said input signals being substantially lower than said constant angular frequency,
(f) resonant means connected between said input means and each of said first and second junctions for substantially isolating said reactance elements from charge transfer at the fundamental and second harmonic components of the constant angular frequency, and
(g) output means connected to said bridge configuration responsive to the interaction between said input signals and said conversion capacitance for developing an amplified replica of said input signal.

2. The amplifier of claim 1 wherein each of said resonant means comprises tuned circuit means resonant at the fundamental and second harmonic components of said constant angular frequency.

3. The amplifier of claim 1 wherein
(a) said first and second pairs of reactance elements comprise first and second pairs of semiconductor diodes; and wherein
(b) the anodes of said first pair of diodes are each connected to said first junction, and wherein
(c) the cathodes of said second pair of diodes are each connected to said second junction.

4. The amplifier of claim 3 and further including a voltage source connected to each of said first and second pair of diodes for reverse biasing said diodes.

5. In a reactance amplifier, the combination comprising:
(a) a pair of reactance means, each having a pair of series connected regions adapted to exhibit non-linear capacitance variations, with each pair of regions having substantially equal overall capacitance;
(b) means for connecting said regions of said pair of reactance means in a bridge configuration having 4 terminals, with the 2nd and 3rd terminals being respectively between said pairs of series regions;

(c) frequency means connected to a 1st terminal of said bridge configuration for driving said regions through capacitance variations at a constant angular frequency;
(d) resonant means connected between a 2nd and 3rd terminals of said bridge configuration resonant at the fundamental and second harmonic components of said constant angular frequency for substantially eliminating charge transfer between said pair of reactance means at said fundamental and second harmonic components and for maintaining a substantially constant overall capacitance for said pair of reactance means;
(e) means for introducing input signals to be amplified to said pair of reactance means connected to said resonant means; and
(f) output means connected to a 4th terminal of said bridge configuration including a tuned circuit resonant at said constant angular frequency connected to said pair of reactance means for producing an amplified output.

6. In a reactance amplifier of the type having variable capacitance means connected in a bridge configuration, the combination comprising:
(a) a first pair of variable capacitance means connected in series by a first junction point between first and second terminals,
(b) a second pair of variable capacitance means connected in series by a second junction point between said first and second terminals,
(c) frequency means coupled to said first terminal for driving said variable capacitance means through regions of capacitance variation at a constant angular frequency,
(d) input means for introducing input signals to be amplified to said first and second junction points for interaction with said capacitance variation,
(e) tuned circuit means resonant at the fundamental and second harmonic components of said constant angular frequency connected between said input means and each of said first and second junctions for substantially isolating said reactance elements from charge transfer at the fundamental and second harmonic component of said constant angular frequency, and
(f) output means coupled to said second terminal for developing an amplified replica of said input signals.

7. The combination of claim 6 wherein said capacitance means vary non-linearly and wherein the overall capacitance of said pair of variable capacitance means is maintained constant at said constant angular frequency by said tuned circuit means.

8. The combination of claim 7 wherein said pair of variable capacitance means comprises a pair of semiconductor diodes having like terminals of a first polarity connected, and said second pair of variable capacitor means comprises a pair of semiconductor diodes having like terminals of a second polarity opposite to said first polarity connected.

References Cited

UNITED STATES PATENTS

| | | | |
|---|---|---|---|
| 3,249,881 | 5/1966 | Deniet | 330—4.9 |
| 3,369,169 | 2/1968 | Jaasma | 321—69 |

ALFRED L. BRODY, Primary Examiner

D. R. HOSTETTER, Assistant Examiner

U.S. Cl. X.R.

330—4.9, 7